United States Patent
Liu

(10) Patent No.: US 11,380,220 B2
(45) Date of Patent: Jul. 5, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yali Liu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 210 days.

(21) Appl. No.: 16/754,193

(22) PCT Filed: Jan. 13, 2020

(86) PCT No.: PCT/CN2020/071628
§ 371 (c)(1),
(2) Date: Apr. 7, 2020

(87) PCT Pub. No.: WO2021/077638
PCT Pub. Date: Apr. 29, 2021

(65) Prior Publication Data
US 2021/0407335 A1 Dec. 30, 2021

(30) Foreign Application Priority Data
Oct. 22, 2019 (CN) .......................... 201911005248.6

(51) Int. Cl.
*H01L 27/32* (2006.01)
*H01L 51/00* (2006.01)
(Continued)

(52) U.S. Cl.
CPC .......... *G09F 9/301* (2013.01); *H01L 27/3276* (2013.01); *H01L 51/0097* (2013.01); *H01L 51/52* (2013.01); *H01L 2251/5338* (2013.01)

(58) Field of Classification Search
CPC . G09F 9/301; H01L 27/3276; H01L 51/0097; H01L 51/52; H01L 2251/5338
See application file for complete search history.

(56) References Cited

U.S. PATENT DOCUMENTS

| 2006/0099808 | A1 | 5/2006 | Kondo | |
| 2015/0055308 | A1* | 2/2015 | Lim | ..................... G04G 17/045 361/749 |
| 2019/0051705 | A1 | 2/2019 | Breedlove et al. | |

FOREIGN PATENT DOCUMENTS

| CN | 104423433 A | 3/2015 |
| CN | 109271050 A | 1/2019 |

(Continued)

*Primary Examiner* — Kyoung Lee

(57) ABSTRACT

The present invention discloses a display panel and a display device. The display panel includes a bending area and a non-bending area, and further includes a display module; a cover module provided on the display module and including an electrorheological layer corresponding to the bending area. The beneficial effect of the present invention is that the display panel and the display device of the present invention are provided with a layer of an electrorheological layer in the bending area of the display panel, which plays a protective and supporting role.

10 Claims, 4 Drawing Sheets

(51) Int. Cl.
*G09F 9/30* (2006.01)
*H01L 51/52* (2006.01)

(56) References Cited

FOREIGN PATENT DOCUMENTS

| | | |
|---|---|---|
| CN | 109564985 A | 4/2019 |
| CN | 109584719 A | 4/2019 |
| CN | 109686260 A | 4/2019 |
| CN | 109887971 A | 6/2019 |
| WO | 2004014115 A1 | 2/2004 |

* cited by examiner

DISPLAY PANEL AND DISPLAY DEVICE

BACKGROUND OF INVENTION

The present application claims priority to Chinese patent application no. 201911005248.6 submitted to Chinese Patent Office on Oct. 22, 2019, entitled "display panel and display device", the entire contents of which are incorporated herein by reference.

FIELD OF INVENTION

The present application relates to a field of display, and in particular, to a display panel and a display device.

DESCRIPTION OF PRIOR ART

At present, foldable flexible display screens have become the focus of researches and development of many screen manufacturers. Due to the principle and physical properties of flexible OLEDs, which are different from liquid crystal displays, the ball dropping height and pencil hardness are difficulties in the development of foldable flexible display screen technologies. A cover module is a key component that supports the foldable flexible display screen and achieves effective bending of the display screen, and at present, all companies mainly use flexible cover module materials, by which the panel can be effectively bent many times. However, the cover module is limited by the nature of flexible polymer materials and cannot reach the effective ball dropping height and pencil hardness of flexible OLED screens, which has become a major problem that must be solved during the development of existing folding screens from research and development to mass production.

At present, the various folding screens mainly use flexible cover module materials, and it is difficult to meet the requirements of ball dropping height, pencil hardness, and wear resistance of the flexible OLED screens.

SUMMARY OF INVENTION

An object of the present invention is to provide a display panel and a display device, which are used to solve the technical problems of reduction in the surface hardness and bending resistance of the display panel in order to ensure the bending degree of the flexible screen in the prior art.

The technical solution to solve the above problem is that the present invention provides a display panel including a bending area and non-bending areas on opposite sides of the bending area, and further including a display module disposed in the bending area and the non-bending areas; and a cover module covering the display module and including an electrorheological layer disposed in the bending area.

Further, the cover module further includes a substrate disposed on a surface of the display module, the electrorheological layer is disposed on a side of the substrate away from the display module, and the electrorheological layer is distributed throughout the bending area and the non-bending areas.

Further, a thickness of the electrorheological layer is 10 µm.

Further, the substrate is a flexible glass substrate.

Further, the electrorheological layer is disposed only in the bending area.

Further, the cover module further includes a buffer portion disposed in the bending area and located between the electrorheological layer and the non-bending areas; and a rigid portion disposed in the non-bending areas and connected to the buffer portion.

Further, the buffer layer is made of a material including a silicone material.

Further, the electrorheological layer includes a wiring structure which is made of a material including a conductive silicone material.

Further, the electrorheological layer is made of an electrorheological material, which is a liquid state when the display panel is bent, and a solid state when the display panel is completely bent or flattened.

The present invention also provides a display device including the display panel.

In the display panel and the display device of the present invention, a layer of an electrorheological layer is provided in a bending area of the display panel. When the display panel is flattened or completely bent, the electrorheological material in the electrorheological layer is in a solid state and has large rigidity, which plays a protective and supporting role. It can reach an effective ball dropping height in a ball dropping test. When the display panel is in the bending process, the electrorheological material in the electrorheological layer is in a liquid state, which is conducive to the realization of free bending of the display panel, while guaranteeing requirements for the dropping performance, hardness, and wear resistance performance.

Figure 1:
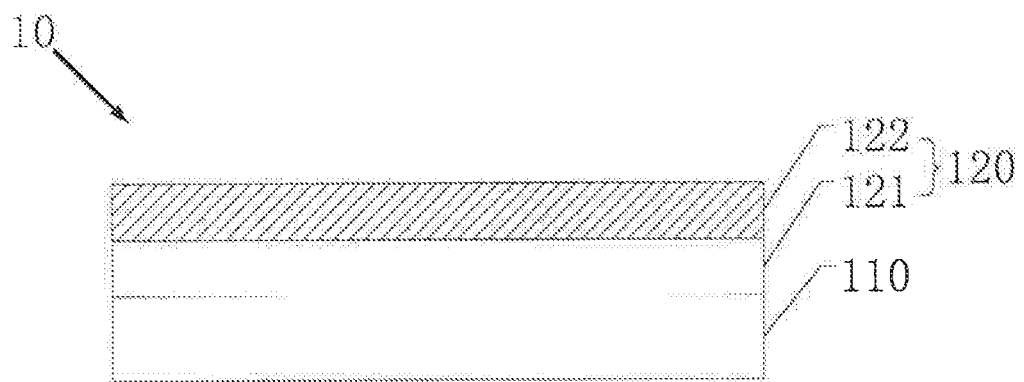
FIG. 1 is a schematic diagram of a display panel according to Embodiment 1.

Elements in the drawings are designated by reference numerals listed below.
10 display panel; 101 bending area;
102 non-bending area; 121 base plate;
122 electrorheological layer; 1231 first electrorheological portion;
1232 buffer portion; 1233 rigid portion;
1221 wiring structure; 1 display device.

DETAILED DESCRIPTION OF PREFERRED EMBODIMENTS

The following description of the various embodiments is provided to illustrate the specific embodiments of the present invention. The spatially relative directional terms mentioned in the present invention, such as "upper", "lower", "before", "after", "left", "right", "top", "bottom", etc. and the like, may be used herein for ease of description to describe one element or feature's relationship to another element(s) or feature(s) as illustrated in the figures which are merely references.

Embodiment 1

As shown in FIG. 1, in this embodiment, the display panel 10 includes a display module 110 and a cover module 120.

The display module 110 includes structural layers such as an array substrate, a color filter substrate, and the like, and is configured to make the display panel display a screen.

The cover module 120 is disposed on the display module 110 and is used to protect the display module 110 from intrusion of impurities, water, and oxygen, thereby improving the service life of the display panel 10.

Figure 2:
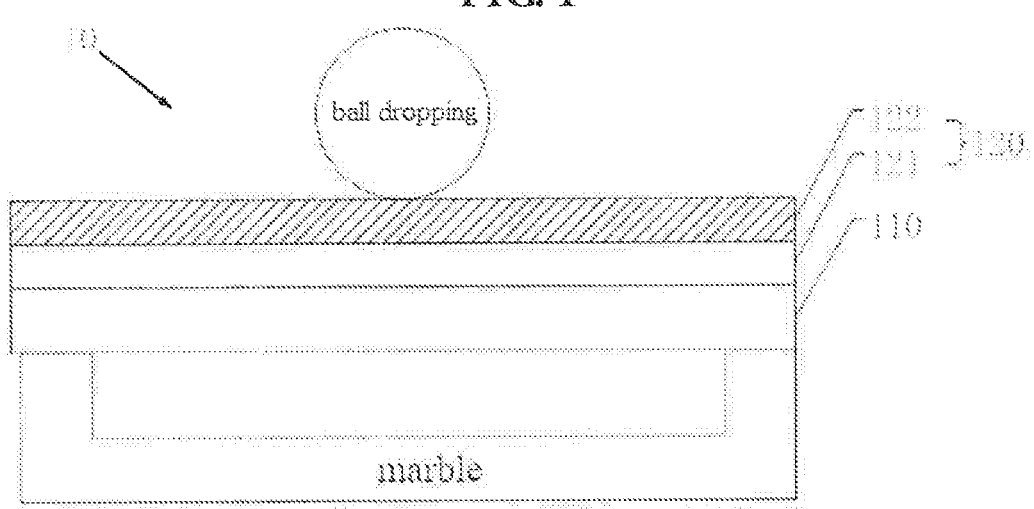
FIG. 2 is a schematic diagram of a ball dropping test according to Embodiment 1.

As shown in FIG. 2, when the display panel 10 is manufactured, a ball dropping test is required to test the impact resistance performance of the cover module 120 on the display panel 10.

Impact resistance is to make a steel ball of a specified quality fall freely on a sample from a predetermined height to cause an impact on the sample, and then check the impact resistance performance by observing whether a surface of the sample has cracks, damages, and color changes.

In this embodiment, the display panel 10 is a full-screen foldable flexible panel. In order to achieve multiple bending, the cover module 120 is made of a flexible material, and in order to achieve an effective hall dropping height, in this embodiment, the cover module 120 includes a substrate 121 and an electrorheological layer 122.

The substrate 121 is disposed on the display module 110, and is a flexible glass substrate made of a transparent flexible material, which is beneficial to the display panel 10 to display a screen, and meanwhile, prevents foreign objects from entering the display panel 10, improving the service life of the display panel 10.

The electrorheological layer 122 is disposed on the substrate 121, and filled with an electrorheological material, wherein the electrorheological material is a fluid that exhibits significant variation in viscosity under an action of an applied electric field, which is a colloidal suspension, and forms a fibrous structure along a direction of the electric field under an action of then applied electric field. Such a structure greatly increases the viscosity of the fluid, so it can be changed from a liquid to a solid in a few milliseconds.

A thickness of the electrorheological material is 10 μm. In order to increase the drop resistance and wear resistance of the display panel 10, a wiring structure 1222 is also arranged in the electrorheological layer 122. The wiring is a highly conductive silicone wire, which has the characteristics of easy bending and high conductivity, and increases bending performance of the cover module 120.

Figure 5:
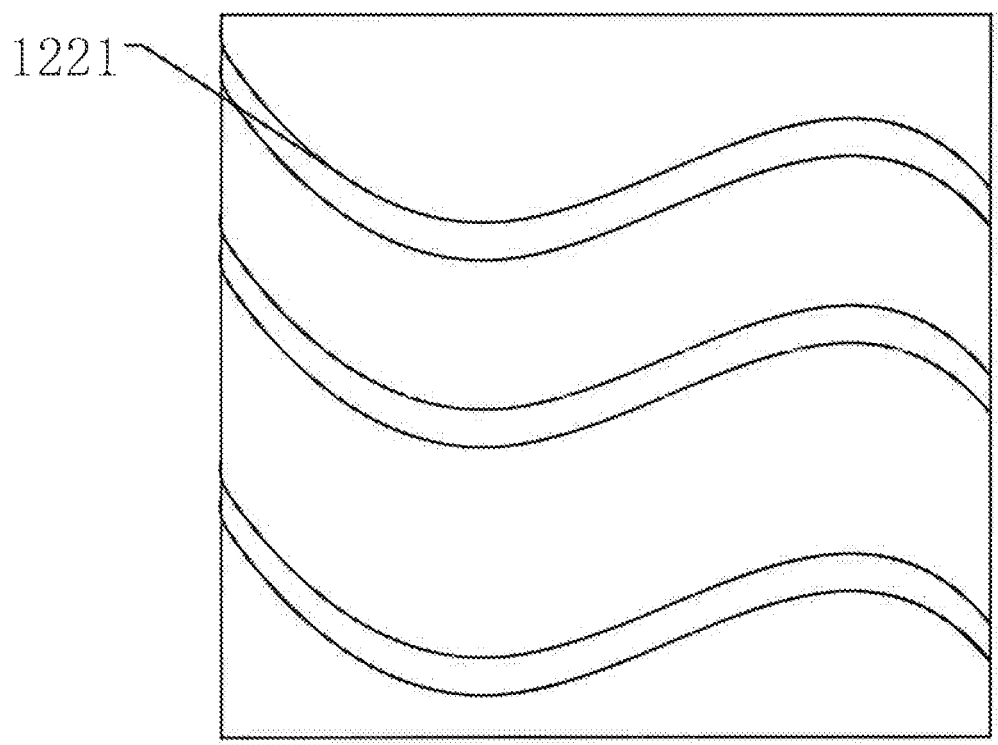
FIG. 5 is a layout diagram of a wiring structure during a bending process of the display panel.
Figure 6:
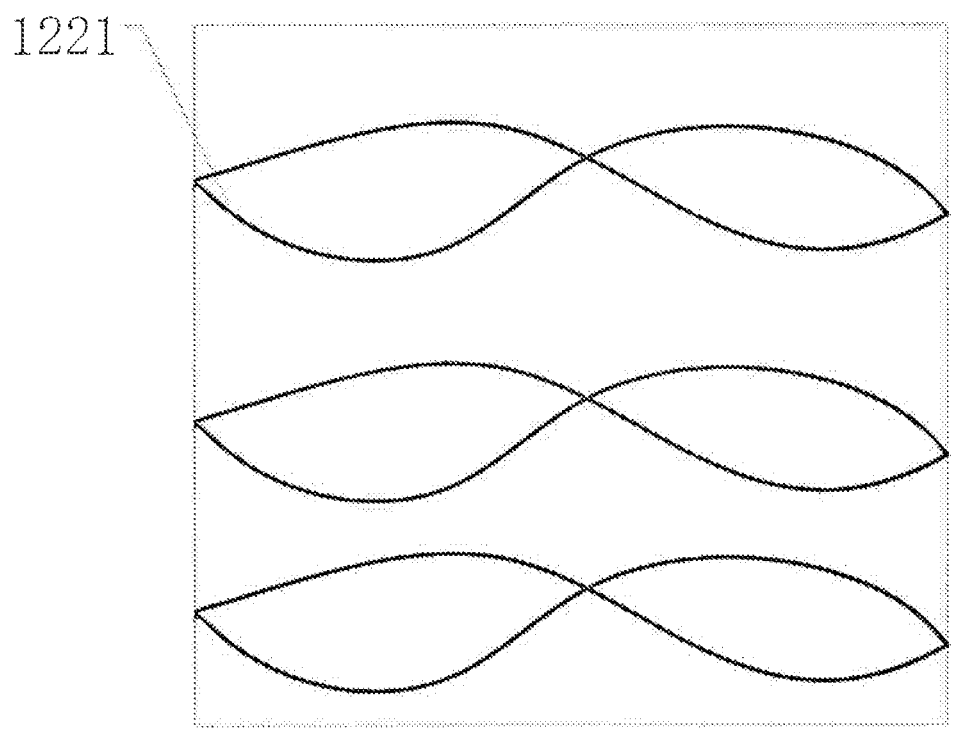
FIG. 6 is a layout diagram of the wiring structure when the panel is flattened or completely bent.
Figure 7:
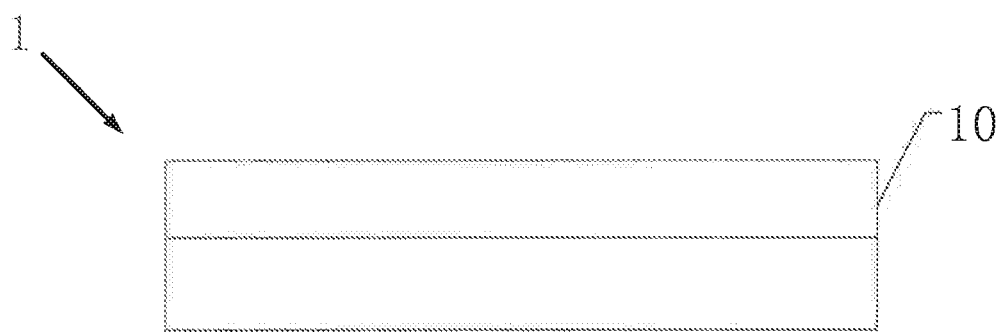
FIG. 7 is a schematic diagram of a display device according to Embodiment 2.

FIG. 5 is a layout diagram of the wiring structure during the display panel 10 is in the bending process, and FIG. 6 is a layout of the wiring structure when the display panel 10 is flattened or completely bent. As shown in FIG. 5 and FIG. 6, the wiring structure 1222 is arranged in a curvilinear form in the electrorheological layer 122 to increase a contact area between the wiring structure 1222 and the electrorheological material.

When the display panel 10 is flattened, the electrorheological material in the electrorheological layer 122 is in a solid state, so that each layer is kept flat under an action of tension, presenting a good display effect, such that the damage to the screen can be cushioned when the ball drops.

When the display panel 10 is in the bending process, no electric field is applied to the electrorheological material, that is, the electrorheological layer 122. The electric field strength of the electrorheological material in the electrorheological layer 122 is gradually increased with a decrease of its strength and hardness, and the electrorheological material gradually becomes liquid, so as to achieve softness in the bending process, to facilitate the bending of the bending area.

When the display panel 10 is completely bent, the display panel 10 applies an electric field to the electrorheological material in the electrorheological layer 122. Within a few milliseconds, the electrorheological material changes from a liquid state to a chain-connected solid state, and the degree of solid state is enhanced with the increase of the electric field, which not only plays a supporting role, realizes effective folding and display of the display screen, but also guarantees the requirements of drop performance, hardness, and wear resistance performance.

In this embodiment, the display panel 10 of the present invention includes a bending area 101 and non-bending areas 102 on opposite sides of the bending area 101.

The display panel 10 includes a display module 110 and a cover module 120.

The display module 110 includes structural layers such as an array substrate, a color filter substrate, and the like, and is configured to make the display panel display a screen.

The cover module 120 is disposed on the display module 110 and is used to protect the display module 110 from intrusion of impurities, water, and oxygen, thereby improving the service life of the display panel 10.

Figure 4:
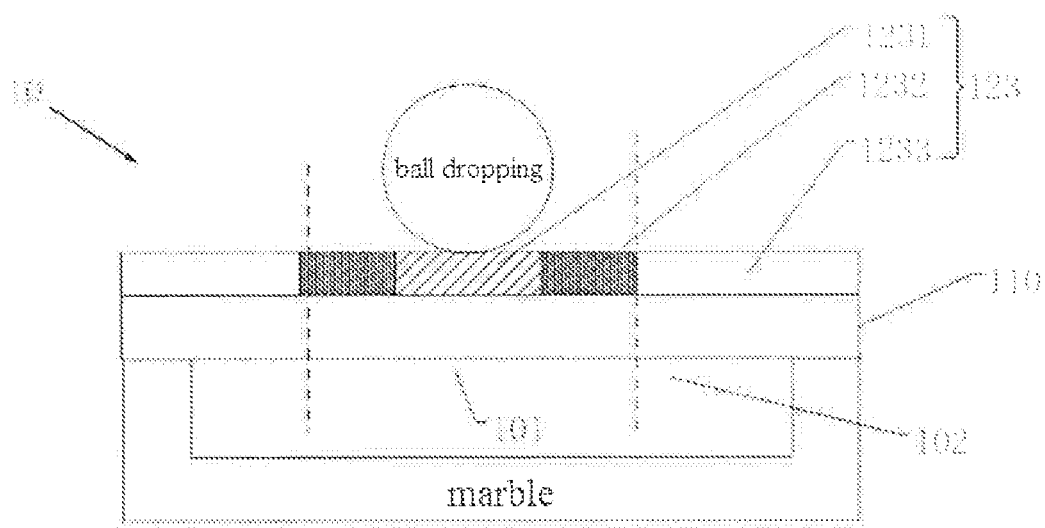
FIG. 4 is a schematic diagram of a ball dropping test according to Embodiment 2.

As shown in FIG. 4, when the display panel 10 is manufactured, a ball dropping test is required to test the impact resistance performance of the cover module 120 on the display panel 10.

Impact resistance is to make a steel ball of a specified quality fall freely on a sample from a predetermined height to cause an impact on the sample, and then check the impact resistance performance by observing whether a surface of the sample has cracks, damages, and color changes.

Figure 3:
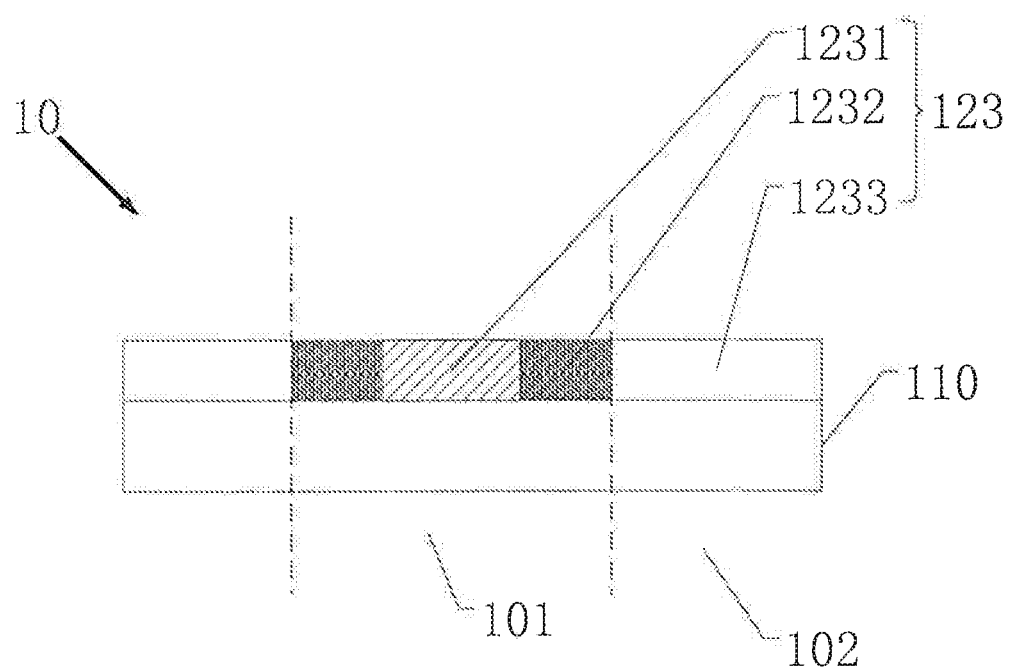
FIG. 3 is a schematic diagram of a display panel according to Embodiment 2.

As shown in FIG. 3, the display panel 10 in this embodiment is a foldable flexible panel. In order to achieve multiple bending, the cover module 120 is made of a flexible material, and in order to achieve an effective ball dropping height, in this embodiment, the cover module 120 includes a second electrorheological layer 123.

The second electrorheological layer 123 is disposed on the display module 110. Specifically, the second electrorheological layer 123 includes a first electrorheological portion 1231, a buffer portion 1232, and a rigid portion 1233.

The first electrorheological portion 1231 is correspondingly provided in the bending area 101 and is filled with an electrorheological material. In order to increase the drop resistance and wear resistance of the display panel 10, a wiring structure 1222 is also arranged in the first electrorheological portion 1231. The wire is a highly conductive silicone wire, which has the characteristics of easy bending and high conductivity, and increases bending performance of the cover module 120.

FIG. 5 is a layout diagram of the wiring structure during the display panel 10 is in the bending process, and FIG. 6 is a layout of the wiring structure when the display panel 10 is flattened or completely bent. As shown in FIG. 5 and FIG. 6, the wiring structure 1222 is arranged in a curvilinear form in the first electrorheological portion 1231 to increase a contact area between the wiring structure 1222 and the electrorheological material.

When the display panel 10 is flattened, the electrorheological material in the first electrorheological portion 1231 is in a solid state, so that each layer is kept flat under an action of tension, presenting a good display effect, such that the damage to the screen can be cushioned when the ball dropping.

When the display panel 10 is in the bending process, no electric field is applied to the electrorheological material, that is, first electrorheological portion 1231. The electric field strength of the electrorheological material in the first electrorheological portion 1231 is gradually increased with a decrease of its strength and hardness, and the electrorheological material gradually becomes liquid, so as to achieve softness in the bending process, to facilitate the bending of the bending area.

When the display panel 10 is completely bent, the display panel 10 applies an electric field to the electrorheological material the first electrorheological portion 1231. Within a few milliseconds, the electrorheological material changes from a liquid state to a chain-connected solid state, and the degree of solid state is enhanced with the increase of the electric field, which not only plays a supporting role, realizes effective folding and display of the display screen, but also guarantees the requirements of drop performance, hardness, and wear resistance performance.

The buffer portion 1232 is made of a silicone material and is provided on opposite sides of the first electrorheological portion 1231, that is, on opposite sides of the bending area 101, to reduce the stress at a contact position between the bending area 101 and the non-bending area 102 bending area 101 during the bending process.

The rigid portion 1233 is disposed in the non-bending area 102 and made of a rigid thin glass to protect the display panel 10 from intrusion of impurities, water, and oxygen, thereby improving the service life of the display panel 10.

In this embodiment, the display device 1 of the present invention includes the display panel 10, as shown in FIL. 7, wherein the main technical features and main technical effects of the display device 1 are collectively embodied on the display panel 10, and the other components of the display device 1 will not be described in detail for brevity.

It can be understood that for a person of ordinary skill in the art, equivalent replacements or changes can be made according to the technical solution of the present application and its inventive concept, and all these changes or replacements should fall within the protection scope of the claims attached to this application.

What is claimed is:

1. A display panel, comprising a bending area and non-bending areas on opposite sides of the bending area, and further comprising a display module disposed in the bending area and the non-bending areas; and a cover module covering the display module and comprising an electrorheological layer disposed in the bending area.

2. The display panel according to claim 1, wherein the cover module further comprises a substrate disposed on a surface of the display module, the electrorheological layer is disposed on a side of the substrate away from the display module, and the electrorheological layer is distributed throughout the bending area and the non-bending areas.

3. The display panel according to claim 2, wherein a thickness of the electrorheological layer is 10 μm.

4. The display panel according to claim 2, wherein the substrate is a flexible glass substrate.

5. The display panel according to claim 1, wherein the electrorheological layer is disposed only in the bending area.

6. The display panel according to claim 5, wherein the cover module further comprises a buffer portion disposed in the bending area and located between the electrorheological layer and the non-bending areas; and a rigid portion disposed in the non-bending areas and connected to the buffer portion.

7. The display panel according to claim 6, wherein the buffer portion is made of a material comprising a silicone material.

8. The display panel according to claim 1, wherein the electrorheological layer comprises a wiring structure which is made of a material comprising a conductive silicone material.

9. The display panel according to claim 1, wherein the electrorheological layer is made of an electrorheological material, which is a liquid state when the display panel is bent, and a solid state when the display panel is completely bent or flattened.

10. A display device, comprising the display panel according to claim 1.

* * * * *